US012140982B2

(12) United States Patent
Ragonese et al.

(10) Patent No.: US 12,140,982 B2
(45) Date of Patent: Nov. 12, 2024

(54) TIME BASED PREDICTIVE MAINTENANCE FOR CAPACITIVE LOADS IN FACTORY AUTOMATION APPLICATIONS

(71) Applicant: STMicroelectronics S.r.l., Agrate Brianza (IT)

(72) Inventors: Domenico Ragonese, Tremestrieri Etneo (IT); Vincenzo Marano, Cinisello Balsamo (IT); Giuseppe Antonio Di Genova, Pozzallo (IT); Marco Minieri, Catania (IT)

(73) Assignee: STMicroelctronics S.r.l., Agrate Brianza (IT)

( * ) Notice: Subject to any disclaimer, the term of this patent is extended or adjusted under 35 U.S.C. 154(b) by 220 days.

(21) Appl. No.: 17/866,701

(22) Filed: Jul. 18, 2022

(65) Prior Publication Data
US 2024/0019885 A1 Jan. 18, 2024

(51) Int. Cl.
*G05F 1/573* (2006.01)

(52) U.S. Cl.
CPC .................................. *G05F 1/573* (2013.01)

(58) Field of Classification Search
CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
See application file for complete search history.

(56) References Cited

U.S. PATENT DOCUMENTS

| | | | |
|---|---|---|---|
| 4,301,490 A | 11/1981 | Nagel et al. | |
| 7,468,877 B2 | 12/2008 | Oki et al. | |
| 10,488,466 B2 | 11/2019 | Parkin | |
| 10,756,640 B1 * | 8/2020 | Radic | H02M 3/335 |
| 11,316,335 B2 | 4/2022 | Namuduri et al. | |
| 2011/0110009 A1 | 5/2011 | Sugimoto et al. | |

(Continued)

FOREIGN PATENT DOCUMENTS

| | | |
|---|---|---|
| CN | 209994092 U | 1/2020 |
| EP | 2088674 B1 | 5/2018 |

OTHER PUBLICATIONS

EPO Search Report and Written Opinion for counterpart EP Appl. No. 23185933.1, report dated Nov. 29, 2023, 10 pgs.

(Continued)

*Primary Examiner* — Thienvu V Tran
*Assistant Examiner* — Nusrat Quddus
(74) *Attorney, Agent, or Firm* — Crowe & Dunlevy LLC

(57) ABSTRACT

Disclosed herein is a system including a power transistor having a first conduction terminal coupled to a supply node, a second conduction terminal coupled to an output node, and a control terminal controlled by a drive signal. The system further includes a driver configured to receive an input voltage from an external component and generate the drive signal based thereupon, and a sense circuit. The sense circuit is configured to, when the power transistor is powering a load coupled to the output node: detect whether the power transistor has entered an overload condition, and if so, determine a duration of time that the power transistor is in the overload condition; and assert a diagnostic signal in response to the duration of time being outside of a time window.

19 Claims, 3 Drawing Sheets

(56) References Cited

U.S. PATENT DOCUMENTS

| | | | |
|---|---|---|---|
| 2012/0206122 A1* | 8/2012 | Dhuyvetter | H02M 3/1563 |
| | | | 323/311 |
| 2013/0232358 A1* | 9/2013 | Park | G06F 1/324 |
| | | | 713/322 |
| 2016/0006386 A1* | 1/2016 | Kurosawa | H02P 25/034 |
| | | | 318/565 |
| 2017/0288662 A1* | 10/2017 | Djelassi | H03K 17/162 |
| 2017/0294154 A1 | 10/2017 | Takeuchi | |
| 2017/0353103 A1* | 12/2017 | Eum | H05B 45/395 |
| 2018/0191254 A1* | 7/2018 | Feng | H02M 1/32 |
| 2019/0013804 A1* | 1/2019 | Bienvenu | H03K 5/24 |
| 2020/0355745 A1* | 11/2020 | Bogus | H02P 27/00 |
| 2021/0099091 A1* | 4/2021 | Sato | G01R 19/165 |
| 2021/0271277 A1* | 9/2021 | Ahmed | G05F 1/575 |
| 2021/0351697 A1* | 11/2021 | Tyagi | H02M 3/158 |
| 2022/0197321 A1* | 6/2022 | Tiagaraj | G05F 1/575 |
| 2024/0019885 A1* | 1/2024 | Ragonese | H03K 17/0822 |

OTHER PUBLICATIONS

Texas Instruments: "TPS272C45 45-mΩ, Dual-Channel Smart High-Side Switch With Diagnostics," SLVSF24B—Dec. 2020, 59 pgs.

\* cited by examiner

TIME BASED PREDICTIVE MAINTENANCE FOR CAPACITIVE LOADS IN FACTORY AUTOMATION APPLICATIONS

TECHNICAL FIELD

This disclosure is related to the field of predictive maintenance and, in particular, to a technique for predicting an impending need for maintenance to be performed on a capacitive load powered by an integrated power supply.

BACKGROUND

Industry 4.0 conceptualizes rapid developments in, and changes to, technology, industries, and processes in the near future due to ever increasing interconnectivity and smart automation. Indeed, the automation of traditional manufacturing and industrial practices, using modern smart technology, large-scale machine-to-machine communication (M2M), and the internet of things (IoT) is envisioned.

This provides for the possibility of self-monitoring smart devices that can analyze and diagnose issues without the need for human intervention. Such self-monitoring provides for the possibility of predictive maintenance. In a factory, damage to or breakdown of a component may cause an unpredictable and unforeseen temporary shutdown in production. Typically, a component degrades before it fails. Therefore, detection of the degradation of the component through self-monitoring before the component fails would allow the preventative replacement of the component before a shutdown in production results. As such, development into the area of predictive maintenance is needed.

SUMMARY

Disclosed herein is a system, including: a power transistor having a first conduction terminal coupled to a supply node, a second conduction terminal coupled to a load node, and a control terminal controlled by a drive signal; a driver configured to receive an input voltage from an external component and generate the drive signal based thereupon; and a sense circuit. The sense circuit is configured to, when the power transistor is powering a load coupled to the load node: detect whether the power transistor has entered an overload condition, and if so, determine a duration of time that the power transistor is in the overload condition; and assert a diagnostic signal in response to the duration of time being outside of a time window.

The time window may be defined by a maximum time, a minimum time, or both a maximum and a minimum time.

The load node may be an output node. The power transistor may be an n-channel transistor, with the first conduction terminal being a drain, with the second conduction terminal being a source, and with the control terminal being a gate. The sense circuit may detect whether the power transistor has entered the overload condition by determining that a drain-to-source voltage of the power transistor exceeds a reference drain-to-source voltage.

The sense circuit may be further configured to assert the diagnostic signal in response to the duration of time being less than a minimum period of time or being above a maximum period of time.

The sense circuit may include: a first comparator configured to: compare a voltage across the first and second conduction terminal of the transistor to a reference voltage and assert its output to indicate that the power transistor has entered the overload condition if the voltage across the first and second conduction terminals exceeds the reference voltage; a counter configured to start in response to assertion of the output of the first comparator, and to stop at a final count in response to deassertion of the output of the first comparator; and a comparison circuit configured to compare the final count to a threshold count indicative of time window and assert the diagnostic signal based thereupon.

The comparison circuit may compare the final count to an upper threshold count and a lower threshold count and assert the diagnostic signal if the final count is greater than the upper threshold count or lower than the lower threshold count, wherein the time window is defined by the upper threshold count and the lower threshold count.

The comparison circuit may include: a first digital comparator configured to receive as input the upper threshold count and the final count, and to assert its output if the final count is greater than the upper threshold count; a second digital comparator configured to receive as input the lower threshold count and the final count, and to assert its output if the final count is less than the lower threshold count; and a logic circuit configured to assert the diagnostic signal in response to assertion of either the output of the first digital comparator or the output of the second digital comparator.

The sense circuit may also include: a protection circuit configured to instruct the driver to modify the drive signal in response to assertion of the output of the first comparator and to cease such instruction in response to deassertion of the output of the first comparator.

The external component may be a controller configured to generate the input voltage based upon a voltage at the supply node, configured to receive the diagnostic signal, and configured to modify the input voltage based upon assertion of the diagnostic signal unless the sensed supply voltage is indicative of an overvoltage condition at the supply node.

The load node may be an input node. The power transistor may be an n-channel transistor, with the second conduction terminal being a drain, with the first conduction terminal being a source, and with the control terminal being a gate. The sense circuit may detect whether the power transistor has entered the overload condition by determining that a drain-to-source voltage of the power transistor exceeds a reference drain-to-source voltage.

The load node may be an output node. The power transistor may be a p-channel transistor with the first conduction terminal being a source, the second conduction terminal being a drain, and with the control terminal being a gate. The sense circuit may detect whether the power transistor has entered the overload condition by determining that a source-to-drain voltage of the power transistor exceeds a reference source-to-drain voltage. The load node may be an input node. The power transistor may be a p-channel transistor with the second conduction terminal being a source, the second conduction terminal being a drain, and with the control terminal being a gate. The sense circuit may detect whether the power transistor has entered the overload condition by determining that a source-to-drain voltage of the power transistor exceeds a reference source-to-drain voltage.

Also disclosed herein is a method, including: while a power transistor is enabling the current flow through a load, detecting whether the power transistor has entered into an overload condition, and if so, determining a duration of time that the power transistor is in the overload condition; making a determination of whether maintenance of the load is to be performed based upon the duration of time; and taking subsequent action based upon the maintenance determination.

The determination of whether maintenance of the load is to be performed may be made by determining whether the duration of time exceeds a threshold determination of time.

The determination of whether maintenance of the load is to be performed may be made by determining whether the duration of time has changed in value as compared to a prior duration of time during which the power transistor was previously in the overload condition by more than a given amount.

Taking the subsequent action may be turning on a light emitting diode or activating an audio output device.

Determining the duration of time that the power transistor is in the overload condition may be performed by: comparing a drain-to-source voltage of the power transistor to a first threshold drain-to-source voltage, beginning counting when the drain-to-source voltage exceeds the first threshold drain-to-source voltage, and ending counting when the drain-to-source voltage no longer exceeds the first threshold drain-to-source voltage; and comparing the drain-to-source voltage of the power transistor to a second threshold drain-to-source voltage, beginning counting when the drain-to-source voltage falls below the second threshold drain-to-source voltage, and ending counting when the drain-to-source voltage rises above the second threshold drain-to-source voltage.

The determining of whether the maintenance of the load is to be performed is based upon the duration of time and whether an overvoltage condition is present on a supply node, and the subsequent action is not taken if the overvoltage condition is present on the supply node.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated.

Figure 1:
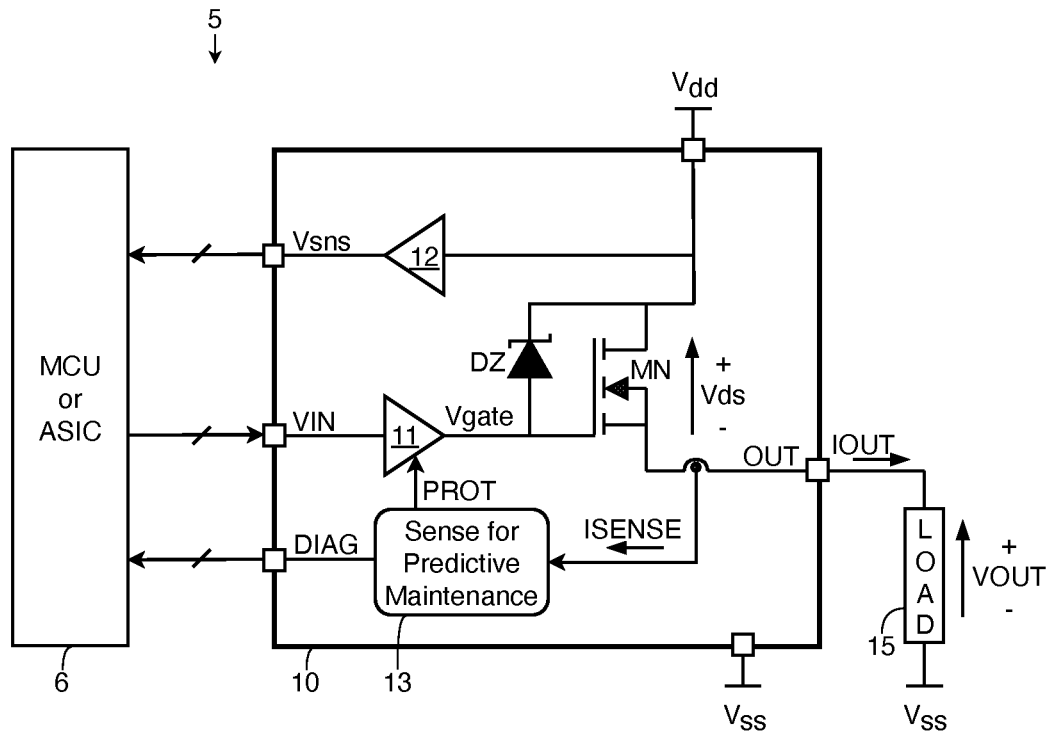
FIG. 1 is a block diagram of an integrated power supply including a sense circuit for monitoring operation and providing predictive maintenance indications about the load based upon the monitoring.

Now described with reference to FIG. 1 is a power system 5 including an integrated power supply 10 operating under control of a microcontroller (MCU) or application specific integrated circuit (ASIC) 6 to power a load 15. The load 15 is a load with capacitive behavior, such as a purely capacitive load or a RC load or RLC load.

The integrated power supply 10 includes a n-channel power transistor MN having its drain connected to a power supply node Vdd, its source connected to an output node OUT, and its gate coupled to receive a drive signal Vgate from a gate driver 11. A Zener diode DZ has its cathode connected to the drain of the transistor MN and its anode connected to the gate of the transistor MN, and serves to short the drain and gate of the transistor MN for protection of the transistor MN when the voltage at its source goes negative (a typical consequence at switch-off of loads with inductive behaviour), A first sense circuit 13 is coupled to the source of the transistor MN to receive a current sensing input, and generates an overload protection output PROT to the driver 11 and a diagnostic flag to the MCU or ASIC 5 as outputs. A second sense circuit 12 has its input connected to the supply node Vdd and generates a sense output Vsns to be provided to the MCU or ASIC 5.

Figure 2:
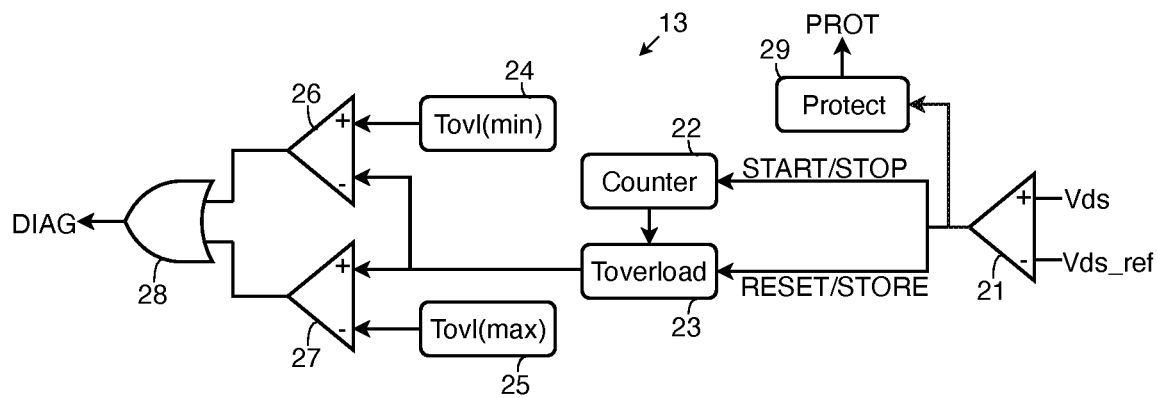
FIG. 2 is a block diagram of the sense circuit of FIG. 1.

Referring now to FIG. 2, the sense circuit 13 includes a comparator 21 that has its non-inverting input terminal connected to the drain-to-source voltage Vds of the transistor MN, its inverting input terminal connected to a drain-to-source reference voltage Vds_ref, and its output connected to a counter 22, a register 23, and a protection circuit 29. The register 23 provides its currently held value as output to an inverting input terminal of digital comparator 26 and a non-inverting input terminal of digital comparator 27. input terminals of digital comparators 26, 27. Another input terminal of the digital comparator 26 is coupled to receive a minimum overvoltage time Tovl(min), and another input terminal of the digital comparator 27 is coupled to receive a maximum overvoltage time Tovl(max). An OR gate 28 receives the outputs of the comparators 26, 27.

Operation will now be described. The MCU or ASIC 6 provides an input drive voltage VIN to the gate driver 11. The input drive voltage VIN is digital, and from VIN, the gate driver 11 suitably generates the drive signal Vgate. The transistor MN operates based upon the drive signal Vdrive to power the load 15.

Figure 3:
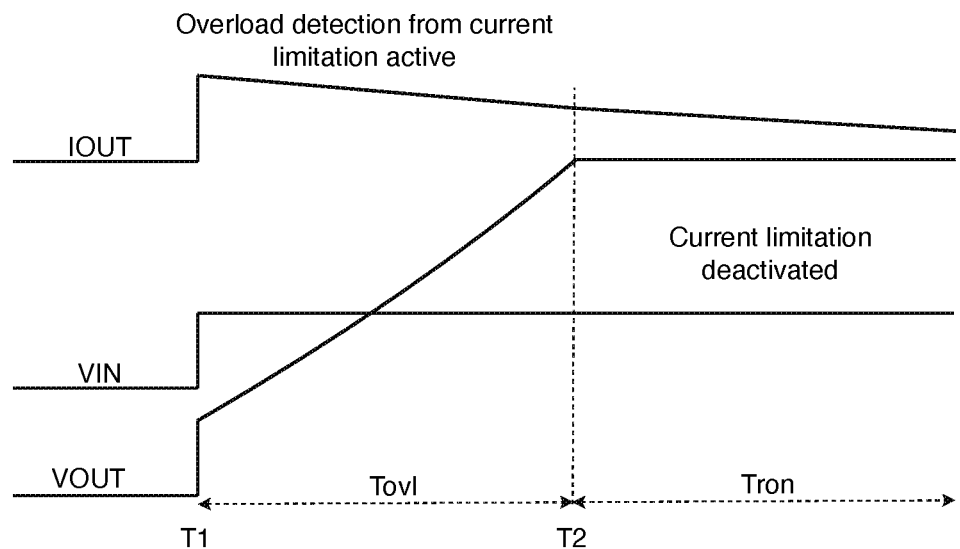
FIG. 3 is a graph showing the inputs and outputs of the integrated power supply during operation with loads having capacitive components.

When the drain-to-source voltage Vds of the transistor MN exceeds the drain-to-source reference voltage Vds_ref, the comparator 21 asserts its output, indicating that the output of power by the transistor MN to the load 15 has resulted in an overload condition. Based upon this output, the protection circuit 29 generates a protection signal PROT fed to the gate driver 11 that causes the gate driver 11 to enter an overload protection mode and reduce the drive signal Vgate accordingly. Due to the capacitive behaviour of the load, as a result of the overload protection mode, the output current IOUT provided to the load is initially the maximum allowed by the control circuit and then decreases, while the output voltage VOUT increases accordingly. This may be observed in the graphs of FIG. 3, between times T1 and T2.

When the comparator 21 asserts its output, that assertion acts as a START signal to the counter 22 and acts as a RESET signal to the register 23. Therefore, when Vds exceeds Vds_ref, the assertion of the output of the comparator 21 causes the contents of the register 23 to be reset and causes the counter 22 to begin counting.

When Vds falls back below Vds_ref, the output of the comparator 21 is deasserted, indicating that the overload condition has ended. This deassertion of the output of the comparator 21 causes the protection circuit 29 to modify or cease the output of the protection signal PROT, allowing the gate driver 11 to enter back into normal operation.

This deassertion of the output of the comparator 21 also acts as a STOP signal to the counter 22, causing the counter 22 to cease counting. The resulting total count is indicative of the duration of time for which the overload condition was present, and is stored as a value Toverload in the register 23.

If Toverload is greater than a maximum overvoltage time Tovl(max), the comparator 26 asserts its output. If Toverload is less than a minimum overvoltage time Tovl(min), the comparator 27 asserts its output. Therefore, if Toverload—which is indicative of the duration of time for which the overload condition was present—is outside the window set by the maximum overvoltage time and the minimum overvoltage time, the OR gate 28 asserts the DIAG signal at its output, indicating the anomaly to the MCU or ASIC 6. The MCU or ASIC 6 may take subsequent action based upon assertion of the DIAG signal, such as providing output to another entity or to the user, or such as modifying (or ceasing) the output provided as the input voltage VIN to the gate driver 11. The providing of output to the user may take the form of activating an alert such, such as by activating a light emitting diode or audio output device controlled by the MCU or ASIC 6.

Additionally or alternatively, the total count Toverload may be read from the register 23 by the MCU or ASIC 6, and each different received value of Toverload may be stored thereby to enable the taking of the subsequent action based upon the trend of the values of Toverload over time. For example, if Toverload has increased by a certain amount over a given number of iterations or if Toverload has decreased by a certain amount over a given number of iterations, the MCU or ASIC 6 may determine that maintenance of the load 15 is to be performed, and may take actions such as providing output to another entity or the user, such as modifying (or ceasing) the output provided as the input voltage VIN to the gate driver 11. The MCU or ASIC 6 may utilize self-learning based upon the values of Toverload over time, enabling updating of the values to which the changes in Toverload over time are compared to, improving efficiency of the predictive maintenance.

The maximum overvoltage time Tovl(max) and minimum overvoltage time Tovl(min) may be set by the MCU or ASIC 6 based upon the electrical characteristics (resistance, capacitance, etc) of the load 15, as well as safe operating conditions (e.g., safe drain current) of the transistor MN. The maximum overvoltage time Tovl(max) and minimum overvoltage time Tovl(min) are set to be such that when the maximum overvoltage time is exceeded, or when the minimum overvoltage time is not met, this is indicative of degradation of the load 15 sufficient to warrant inspection and maintenance but as of yet insufficient to result in malfunction of the load 15. This way, preventative maintenance can be scheduled, avoiding excess downtime of the load (which may be a machine within a factory), potentially avoiding a downstream malfunction causes by malfunction of the load.

When an overload condition occurs and the DIAG signal is asserted, the MCU or ASIC 6 checks whether an overvoltage condition is present on Vsns, since the overload condition could be a consequence of an overvoltage condition on the supply voltage Vdd. Therefore, the MCU or ASIC 6 may be set to ignore assertions of the DIAG signal resulting from cases where the overload condition was not caused by the load 15.

Figure 4:
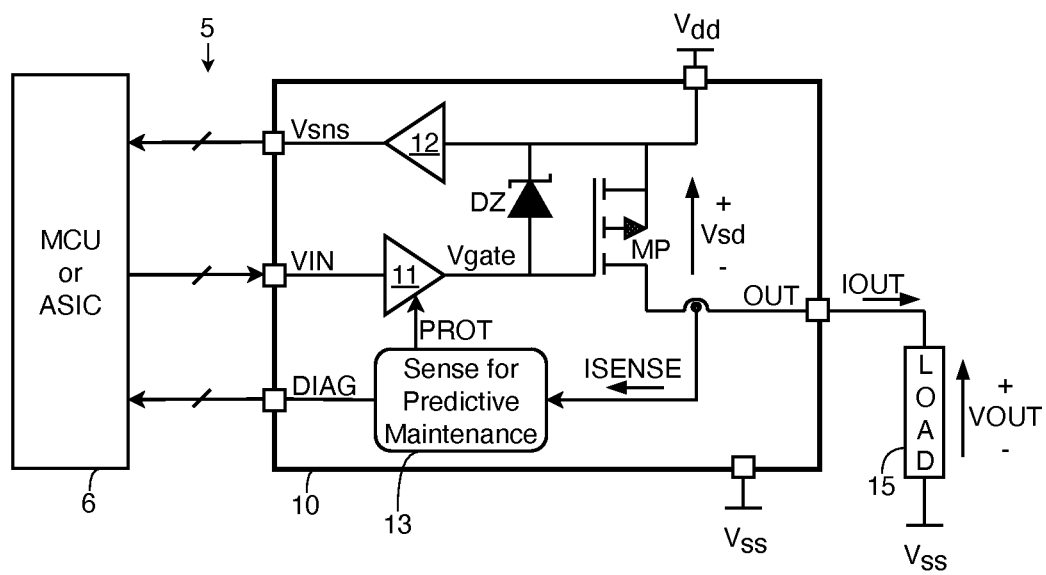
FIG. 4 is a block diagram of a version of the integrated power supply disclosed herein in which the power transistor is a p-channel transistor.
Figure 5:
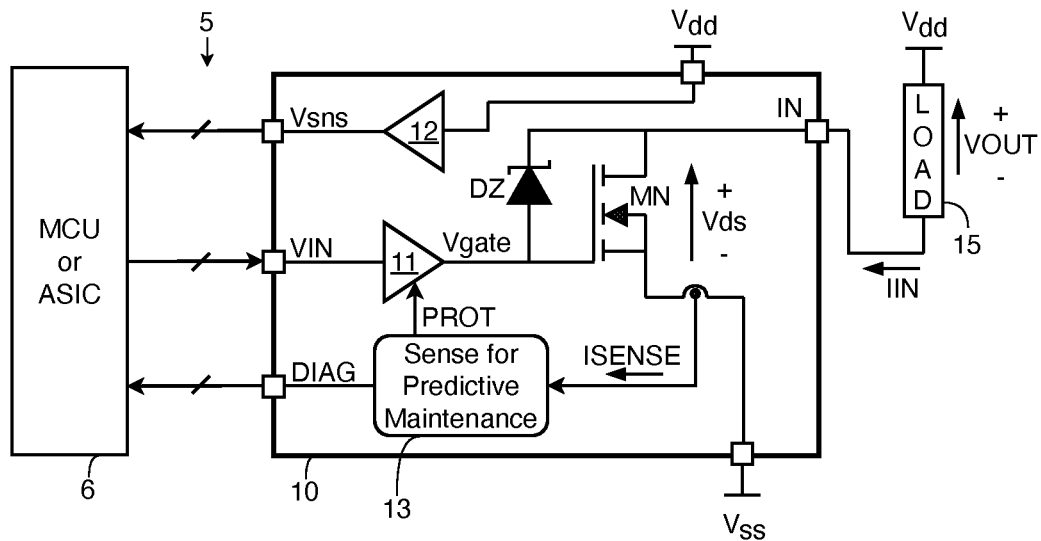
FIG. 5 is a block diagram of a version of the integrated power supply disclosed herein in which the load is connected between the power supply voltage and the power transistor.
Figure 6:
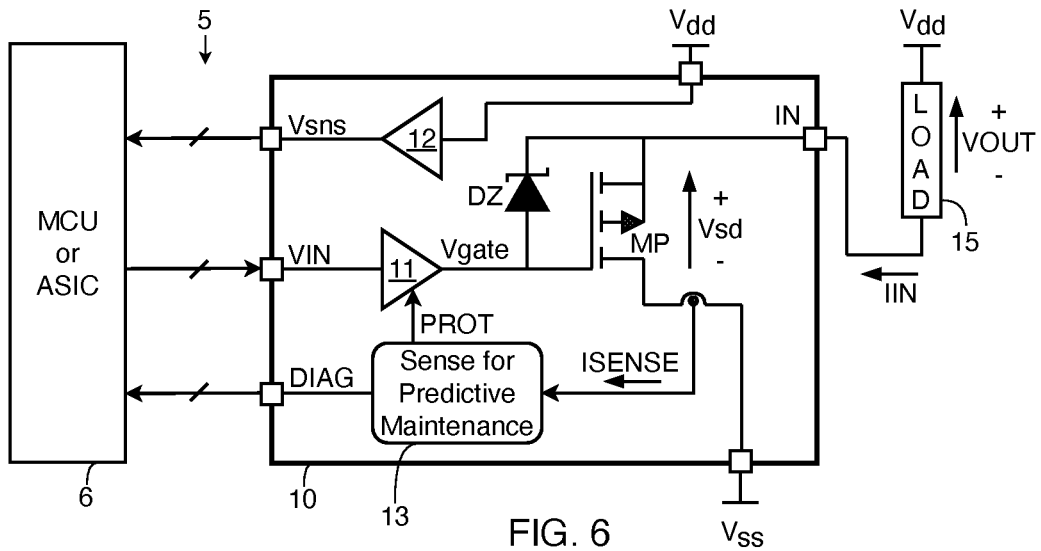
FIG. 6 is a block diagram of a version of the integrated power supply disclosed herein in which the load is connected between the power supply voltage and the power transistor and in which the power transistor is a p-channel transistor.

It is clear that modifications and variations may be made to what has been described and illustrated herein, without thereby departing from the scope of this disclosure, as defined in the annexed claims. For example, in the above disclosure, the transistor MN is an n-channel transistor, but may instead be a p-channel transistor MP, as shown in FIG. 4. In addition, in the above disclosure, the load 15 is a low-side load, but may instead be a high-side load, as shown in FIG. 5 in which the load 15 is connected between Vdd and the drain of MN. Still further, the transistor may be a p-channel transistor MP and the load 15 may be a high-side load with the load 15 being connected between Vdd and the source of MP, as shown in FIG. 6.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:
1. A system, comprising:
a power transistor having a first conduction terminal coupled to a supply node, a second conduction terminal coupled to a load node, and a control terminal controlled by a drive signal;
a driver configured to receive an input voltage from an external component and generate the drive signal based thereupon;
a sense circuit configured to, when the power transistor is powering a load coupled to the load node:
detect whether the power transistor has entered an overload condition, and if so, determine a duration of time that the power transistor is in the overload condition; and
assert a diagnostic signal in response to the duration of time being outside of a time window;
wherein the sense circuit comprises:
a first comparator configured to compare a voltage across the first and second conduction terminal of the transistor to a reference voltage and assert its output to indicate that the power transistor has entered the overload condition if the voltage across the first and second conduction terminals exceeds the reference voltage;
a counter configured to start in response to assertion of the output of the first comparator, and to stop at a final count in response to deassertion of the output of the first comparator; and
a comparison circuit configured to compare the final count to a threshold count indicative of the time window and assert the diagnostic signal based thereupon; and wherein the comparison circuit comprises:
a first digital comparator configured to receive as input the upper threshold count and the final count, and to assert its output if the final count is greater than the upper threshold count;
a second digital comparator configured to receive as input the lower threshold count and the final count, and to assert its output if the final count is less than the lower threshold count; and
a logic circuit configured to assert the diagnostic signal in response to assertion of either the output of the first digital comparator or the output of the second digital comparator.

2. The system of claim 1, wherein the time window is defined by a maximum time, a minimum time, or both a maximum and a minimum time.

3. The system of claim 1, wherein the load node is an output node; wherein the power transistor comprises an n-channel transistor, with the first conduction terminal being a drain, with the second conduction terminal being a source, and with the control terminal being a gate; and wherein the sense circuit detects whether the power transistor has entered the overload condition by determining that a drain-to-source voltage of the power transistor exceeds a reference drain-to-source voltage.

4. The system of claim 1, wherein the sense circuit is further configured to assert the diagnostic signal in response to the duration of time being less than a minimum period of time.

5. The system of claim 1, wherein the sense circuit is further configured to assert the diagnostic signal in response to the duration of time being greater than a maximum period of time.

6. The system of claim 1, wherein the comparison circuit compares the final count to an upper threshold count indicative of a maximum period of time and asserts the diagnostic signal if the final count is greater than the upper threshold count, with the upper threshold count being indicative of the time window.

7. The system of claim 1, wherein the comparison circuit compares the final count to a lower threshold count indicative of a minimum period of time and asserts the diagnostic signal if the final count is lower than the lower threshold count, with the lower threshold count being indicative of the time window.

8. The system of claim 1, wherein the comparison circuit compares the final count to an upper threshold count and a lower threshold count and asserts the diagnostic signal if the final count is greater than the upper threshold count or lower than the lower threshold count, wherein the time window is defined by the upper threshold count and the lower threshold count.

9. The system of claim 1, wherein the sense circuit further comprises: a protection circuit configured to instruct the driver to modify the drive signal in response to assertion of the output of the first comparator and to cease such instruction in response to deassertion of the output of the first comparator.

10. The system of claim 1, wherein the external component is a controller configured to generate the input voltage, configured to receive the diagnostic signal, and configured to modify the input voltage based upon assertion of the diagnostic signal.

11. The system of claim 1, wherein the load node is an input node; wherein the power transistor comprises an n-channel transistor, with the second conduction terminal being a drain, with the first conduction terminal being a source, and with the control terminal being a gate; and wherein the sense circuit detects whether the power transistor has entered the overload condition by determining that a drain-to-source voltage of the power transistor exceeds a reference drain-to-source voltage.

12. The system of claim 1, wherein the load node is an output node; wherein the power transistor comprises a p-channel transistor with the first conduction terminal being a source, the second conduction terminal being a drain, and with the control terminal being a gate; and wherein the sense circuit detects whether the power transistor has entered the overload condition by determining that a source-to-drain voltage of the power transistor exceeds a reference source-to-drain voltage.

13. The system of claim 1, further comprising a supply sense circuit configured to sense a supply voltage at the supply node and output the sensed supply voltage; and wherein the external component is a controller configured to: generate the input voltage, receive the diagnostic signal, and modify the input voltage based upon assertion of the diagnostic signal unless the sensed supply voltage is indicative of an overvoltage condition at the supply node.

14. A method comprising:
while a power transistor enables powering a load, detecting whether the power transistor has entered into an overload condition, and if so, determining a duration of time that the power transistor is in the overload condition;
making a determination of whether maintenance of the load is to be performed based upon the duration of time; and
taking subsequent action based upon the maintenance determination;
wherein the determination of whether maintenance of the load is to be performed is made by determining whether the duration of time has changed in value as compared to a prior duration of time during which the power transistor was previously in the overload condition by more than a given amount.

15. The method of claim 14, wherein the determination of whether maintenance of the load is to be performed is made by determining whether the duration of time exceeds a threshold determination of time.

16. The method of claim 14, wherein determining the duration of time that the power transistor is in the overload condition is performed by:
comparing a drain-to-source voltage of the power transistor to a first threshold drain-to-source voltage, beginning counting when the drain-to-source voltage exceeds the first threshold drain-to-source voltage, and ending counting when the drain-to-source voltage no longer exceeds the first threshold drain-to-source voltage.

17. The method of claim 14, wherein determining the duration of time that the power transistor is in the overload condition is performed by:
comparing a drain-to-source voltage of the power transistor to a second threshold drain-to-source voltage, beginning counting when the drain-to-source voltage falls below the second threshold drain-to-source voltage, and ending counting when the drain-to-source voltage rises above the second threshold drain-to-source voltage.

18. The method of claim 14, wherein taking the subsequent action comprises turning on a light emitting diode or activating an audio output device.

19. The method of claim 14,
wherein determining the duration of time that the power transistor is in the overload condition is performed by:
comparing a drain-to-source voltage of the power transistor to a first threshold drain-to-source voltage, beginning counting when the drain-to-source voltage exceeds the first threshold drain-to-source voltage, and ending counting when the drain-to-source voltage no longer exceeds the first threshold drain-to-source voltage; and
comparing the drain-to-source voltage of the power transistor to a second threshold drain-to-source voltage, beginning counting when the drain-to-source voltage falls below the second threshold drain-to-source voltage, and ending counting when the drain-to-source voltage rises above the second threshold drain-to-source voltage.

\* \* \* \* \*